(12) United States Patent
Chuang

(10) Patent No.: US 7,136,286 B2
(45) Date of Patent: Nov. 14, 2006

(54) INDUSTRIAL COMPUTER WITH ALUMINUM CASE HAVING FINS AS RADIATING DEVICE

(75) Inventor: Yung-Shun Chuang, Hsin-Tien (TW)

(73) Assignee: Aaeon Technology Inc., Taipei (TW)

( * ) Notice: Subject to any disclaimer, the term of this patent is extended or adjusted under 35 U.S.C. 154(b) by 74 days.

(21) Appl. No.: 11/030,975

(22) Filed: Jan. 10, 2005

(65) Prior Publication Data

US 2006/0152904 A1   Jul. 13, 2006

(51) Int. Cl.
*H05K 7/20* (2006.01)

(52) U.S. Cl. ............ 361/703; 361/704; 361/715; 361/730; 174/17 VA

(58) Field of Classification Search ......... 361/687, 361/690, 704, 697, 707, 709, 710, 711, 714, 361/719, 730, 752, 753, 796; 312/223.1, 312/223.2; 248/316.7; 174/15.1, 15.2, 16.3; 165/80.3, 185
See application file for complete search history.

(56) References Cited

U.S. PATENT DOCUMENTS

| | | | |
|---|---|---|---|
| 4,557,225 A * | 12/1985 | Sagues et al. ........... 123/41.31 |
| 4,656,559 A * | 4/1987 | Fathi ...................... 361/721 |
| 5,742,478 A * | 4/1998 | Wu ......................... 361/704 |
| 5,903,435 A * | 5/1999 | Hsieh et al. .............. 361/704 |
| 5,978,221 A * | 11/1999 | Sawa et al. ............... 361/704 |
| 6,046,908 A * | 4/2000 | Feng ........................ 361/707 |
| 6,144,556 A * | 11/2000 | Lanclos .................... 361/695 |
| 6,411,514 B1 * | 6/2002 | Hussaini ................... 361/704 |
| 6,434,000 B1 * | 8/2002 | Pandolfi ................... 361/685 |
| 6,549,414 B1 * | 4/2003 | Tokuhara et al. ......... 361/719 |
| 6,839,232 B1 * | 1/2005 | Elo et al. .................. 361/690 |
| 6,979,772 B1 * | 12/2005 | Meng-Cheng et al. .. 174/17 VA |
| 2004/0218362 A1 * | 11/2004 | Amaro et al. ............. 361/697 |
| 2005/0030719 A1 * | 2/2005 | Lin et al. .................. 361/719 |

* cited by examiner

*Primary Examiner*—Michael Datskovskiy
(74) *Attorney, Agent, or Firm*—Rabin & Berdo, P.C.

(57) ABSTRACT

An industrial computer without a fan is provided. The industrial computer comprises an aluminum case including a plurality of top fins projected toward a vertical direction and a plurality of side fins projected toward a horizontal direction; a motherboard including a plurality of heat-generating members such as CPU and north-bridge chipset formed thereon; and a radiating member having a top in contact with an inner surface of the case and a bottom rested upon the heat-generating members.

4 Claims, 2 Drawing Sheets

INDUSTRIAL COMPUTER WITH ALUMINUM CASE HAVING FINS AS RADIATING DEVICE

FIELD OF THE INVENTION

The present invention relates to radiating devices of computer and more particularly to an industrial computer having an aluminum case including a plurality of parallel fins provided on its outer surface such that generated heat can be effectively sent out via the fins by providing an internal radiating member interconnected the case and heat-generating elements of the computer rather than providing a conventional fan therein.

BACKGROUND OF THE INVENTION

Heat is generated from heat-generating elements (e.g., CPU or the like) of a computer during operation. Such heat is superfluous (e.g., equivalent to heat generated by a 80 W lamp) as the operating rate (e.g., more than 3 GHz) of the CPU increases significantly. Thus, how to effectively send out superfluous heat from inside of the computer is an important issue. Such issue is even critical for an industrial computer since it is more compact than conventional desktop computers and its operating environment is more severe.

Fins of a conventional radiating device mounted in a computer are made of either aluminum or copper. For the latter, it has heat conductivity higher than that of aluminum. However, copper has a higher specific weight, hardness, melting point, and cost, and thus, its market share is only 5%. For a radiating device formed of aluminum, its heat dissipation capability is poor as detailed below.

Heat generated by the heat-generating elements of the computer during operation can be sent out to the ambient by conduction, convection, radiation, or any combination thereof. It is also known that temperature of any heat-generating element must be kept under an allowable maximum operating temperature. Otherwise, the computer may malfunction. Typically, the radiating device are in contact with the heat-generating elements for absorbing heat and a plurality of fins projected from an outer surface of the radiating device are adapted to send out superfluous heat to the ambient. The provision of fins aims at increasing area in contact with air so that more heat can be sent out per unit time by convection. Thus, the larger of the total area of the fins the larger of radiated heat will be. Moreover, a fan is provided proximate the fins so as to further increase convection. However, as stated above, the internal space of an industrial computer is too small to effectively radiate heat by the prior arrangement. To the worse, some types of industrial computer even do not have a sufficient internal space to mount a fan therein. Thus, continuing improvements in the exploitation of radiating device of industrial computer are constantly being sought.

SUMMARY OF THE INVENTION

It is an object of the present invention to provide a simple and effective radiating device.

It is another object of the present invention to provide a radiating device particularly suitable for a compact industrial computer.

To achieve the above and other objects, the present invention provides an industrial computer without a fan and the industrial computer comprises an aluminum case including a plurality of parallel, elongated first fins formed on a top and a plurality of parallel, elongated second fins formed on either side; a motherboard including a plurality of heat-generating members formed thereon; and a radiating member having a top in contact with an inner surface of the case and a bottom rested upon the heat-generating members.

In one aspect of the present invention, the heat-generating members comprise a CPU and a north-bridge chipset.

In another aspect of the present invention, the radiating member is shaped to conform to tops of the heat-generating members.

In a further aspect of the present invention, the first fins are projected toward a vertical direction and the second fins are projected toward a horizontal direction.

The above and other objects, features and advantages of the present invention will become apparent from the following detailed description taken with the accompanying drawings.

DETAILED DESCRIPTION OF THE PREFERRED EMBODIMENTS

Figure 1:
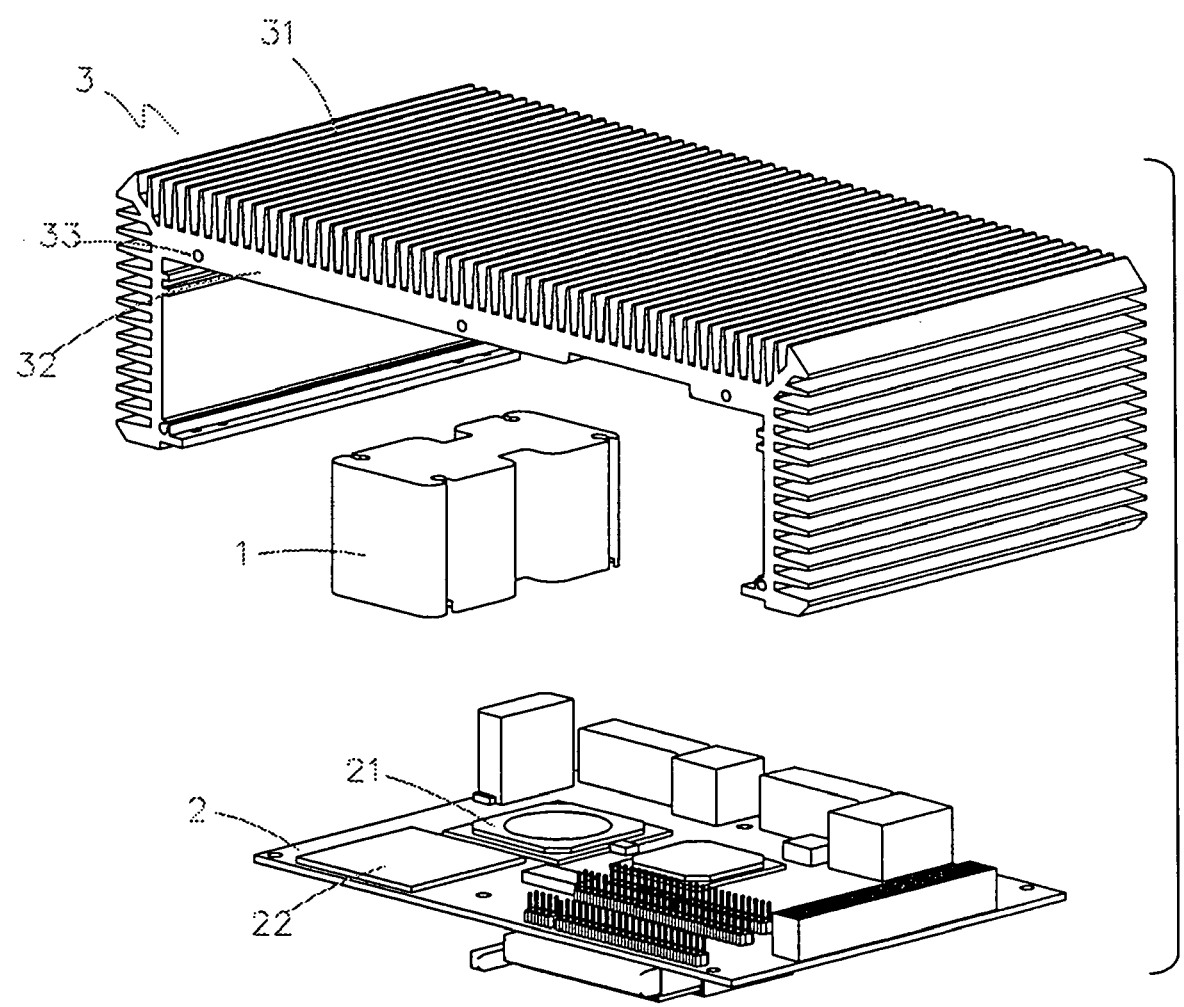
FIG. 1 is an exploded view of a preferred embodiment of industrial computer having a radiating arrangement according to the invention.
Figure 2:
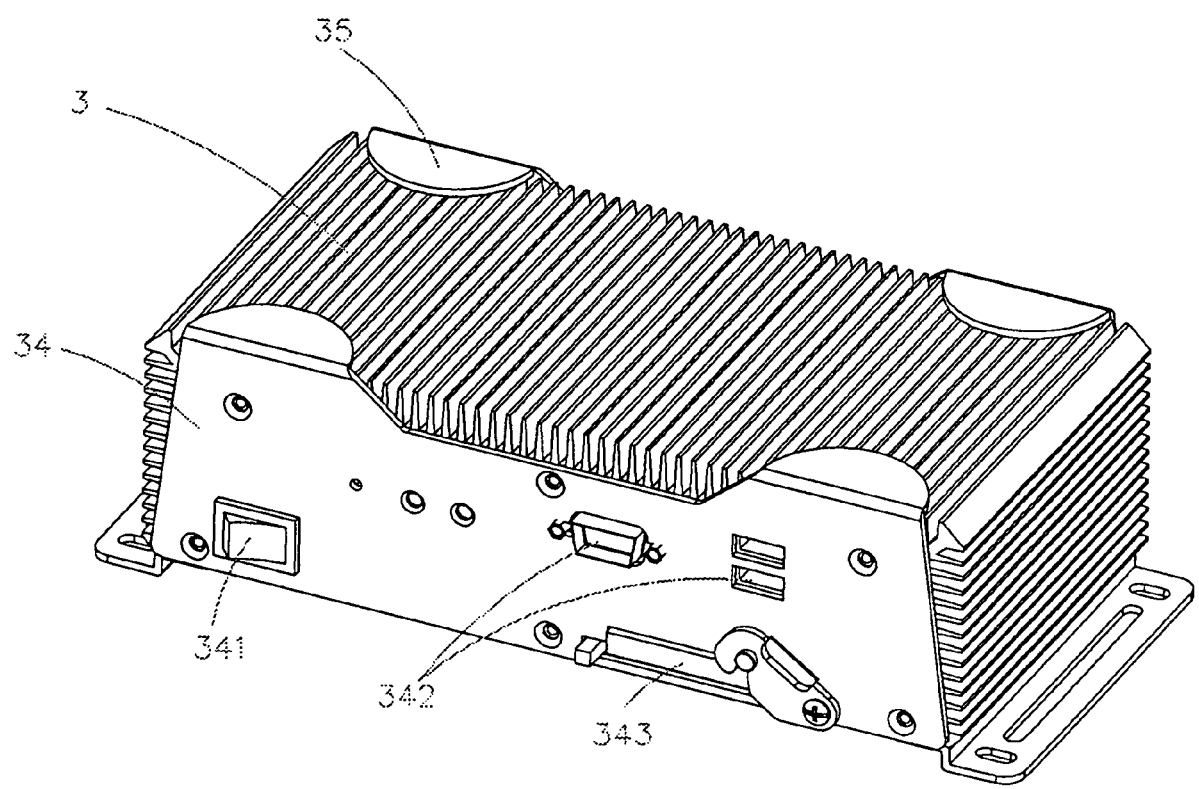
FIG. 2 is a perspective view of the assembled industrial computer.

Referring to FIGS. 1 and 2, there is shown an industrial computer constructed in accordance with a preferred embodiment of the invention. The industrial computer comprises a radiating member 1, a motherboard 2, and a radiating case 3. Each component will be described in detailed below.

The radiating case 3 is formed of aluminum material and is produced by extrusion. The radiating case 3 comprises a top with a plurality of parallel, elongated fins 31 formed thereon, and two sides each with a plurality of parallel, elongated fins 31 formed thereon in which the fins 31 on the top are projected toward a vertical direction and the fins on the sides are projected toward a horizontal direction. The provision of the fins 31 aims at increasing area in contact with air so that more heat can be sent out per unit time by convection. The radiating case 3 further comprises flat front and rear sides 32 each having a plurality of threaded holes 33 so that front and rear plates 35 and 34 can be threadedly secured to the front and rear sides 32 by driving screws through the front and rear plates 35 and 34 into the threaded holes 33. An on/off switch 341, a plurality of ports 342, and a memory card insertion slot 343 are provided on the rear plate 34. The internal radiating member 1 has a flat top in contact with an inner surface of the radiating case 3 and a bottom rested upon a plurality of heat-generating elements (e.g., CPU 21 and north-bridge chipset 22) on the motherboard 2. The radiating member 1 is shaped to conform to tops of the heat-generating elements.

After powering on the industrial computer, heat is generated by the CPU 21 and the north-bridge chipset 22 and will be absorbed by the radiating member 1 by conduction. Heat is then conducted to the radiating case 3 via the radiating member 1. Eventually, heat is radiated to the ambient by the fins 31. The invention can effectively send out superfluous heat generated by a plurality of heat-generating elements of an industrial computer during operation without the help of a conventional fan.

While the invention herein disclosed has been described by means of specific embodiments, numerous modifications and variations could be made thereto by those skilled in the art without departing from the scope and spirit of the invention set forth in the claims.

What is claimed is:

1. An industrial computer, comprising:
    an aluminum case including a plurality of parallel, elongated first fins formed on a top and a plurality of parallel, elongated second fins formed on left and right sides thereof, said aluminum case further having open front and rear sides;
    a motherboard including a plurality of heat-generating members formed thereon;
    a radiating member having a flat top in contact with an inner surface of the case and a bottom rested upon the heat-generating members; and
    front and rear plates fastenable to said aluminum case to respectively cover the open front and rear sides, at least one of said plates having an on/off switch, a port and an insertion slot.

2. The industrial computer of claim 1, wherein the heat-generating members comprise a CPU and a north-bridge chipset.

3. The industrial computer of claim 1, wherein the radiating member is shaped to conform to tops of the heat-generating members.

4. The industrial computer of claim 1, wherein the first fins are projected toward a vertical direction and the second fins are projected toward a horizontal direction.

* * * * *